United States Patent [19]
Babich et al.

[11] Patent Number: 5,457,005
[45] Date of Patent: Oct. 10, 1995

[54] DRY DEVELOPABLE PHOTORESIST AND USE THEREOF

[75] Inventors: Edward D. Babich, Chappaqua, N.Y.; Jeffrey D. Gelorme, Plainville, Conn.; Ronald W. Nunes; Sharon L. Nunes, both of Hopewell Junction, N.Y.; Jurij R. Paraszczak, Pleasantville, N.Y.; Russell J. Serino, Ridgefield, Conn.

[73] Assignee: International Business Machines Corporation, Armonk, N.Y.

[21] Appl. No.: 85,041

[22] Filed: Jul. 2, 1993

Related U.S. Application Data

[62] Division of Ser. No. 693,999, Apr. 29, 1991, Pat. No. 5,229,251.

[51] Int. Cl.[6] ........................................... G03C 5/00
[52] U.S. Cl. ........................ 430/296; 430/325; 430/330; 430/921; 430/942
[58] Field of Search ..................... 430/280, 296, 430/325, 330, 921, 942; 522/31, 134, 146, 170

[56] References Cited

U.S. PATENT DOCUMENTS

| | | | |
|---|---|---|---|
| 4,241,165 | 12/1980 | Hughes et al. | 430/325 X |
| 4,297,401 | 10/1981 | Chern et al. | 522/170 |
| 4,426,431 | 1/1984 | Harasta et al. | 430/14 |
| 4,433,044 | 2/1984 | Meyer et al. | 430/271 |
| 4,481,279 | 11/1984 | Naito et al. | 430/280 |
| 4,551,417 | 11/1985 | Suzuki et al. | 430/316 |
| 4,751,170 | 6/1988 | Mimura et al. | 430/296 |
| 4,940,651 | 7/1990 | Brown et al. | 430/280 X |
| 5,041,358 | 8/1991 | Hatzakis et al. | 430/280 |
| 5,059,512 | 10/1991 | Babich et al. | 430/280 |

FOREIGN PATENT DOCUMENTS

| | | | |
|---|---|---|---|
| 59-140267 | 8/1984 | Japan | 522/31 |

OTHER PUBLICATIONS

Iwayanagi, et al., Deep-UP Lithography, Electronic and Photonic Applications of Polymers, Advances in Chemistry Series 218, 192nd Meeting of the American Chemical Society, California, Sep. 7-12, 1986, pp. 163-166.

MacDonald, et al., A New Oxygen Plasma Developable UV Sensitive Resist, Research Report, RJ 4834 (51095) Oct. 7, 1986 Chemistry.

*Primary Examiner*—Marion E. McCamish
*Assistant Examiner*—Bernard Codd
*Attorney, Agent, or Firm*—Pollock, Vande Sande & Priddy

[57] ABSTRACT

A dry developable photoresist composition that contains in admixture a polymeric epoxide; a di- or polyfunctional organosilicon material; and an onium salt; and use thereof to produce an image.

15 Claims, No Drawings

DRY DEVELOPABLE PHOTORESIST AND USE THEREOF

This is a divisional application of Ser. No. 07/693,999, filed on Apr. 29, 1991, U.S. Pat. No. 5,229,251.

TECHNICAL FIELD

The present invention is concerned with compositions which are capable of being imaged upon exposure to actinic radiation. The compositions of the present invention, after exposure to actinic radiation and crosslinking, are also resistant to oxygen-containing plasmas. In addition, the present invention is concerned with the use of the compositions in lithography. For example, the compositions of the present invention are suitable for imaging on all optical lithography tools and for packaging applications, such as multi-layer ceramic packaging devices.

BACKGROUND ART

In the manufacture of patterned devices, such as semiconductor chips and chip carriers, the processes of etching different layers which constitute the finished product are among the most crucial steps involved. One method widely employed in the etching process is to overlay the surface to be etched with a suitable mask and then to immerse the substrate and mask in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the selectivity of direction (anisotropy) considered necessary to achieve optimum dimensional consistent with current processing requirements.

Moreover, such wet etching processes are undesirable because of the environmental and safety concerns associated therewith. Often the solvents suggested are toxic; thereby creating disposal problems.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls. A particular reactive ion etching process is disclosed, for example, in U.S. Pat. No. 4,283,249 to Ephrath, disclosure of which is incorporated herein by reference.

One problem associated with "dry processing" techniques is providing a patternable material which is sensitive to imaging radiation while, at the same time, being sufficiently resistant to the dry etching environment. In many instances, resistance to the dry etching, such as to the plasma etching active species, results in erosion of the mask material and the loss of resolution that had been generated by the lithographic exposure to the imaging radiation.

This is true for both positive organic resist materials and negative organic resist materials. A positive resist material is one which on exposure to imaging radiation is capable of being rendered soluble in a solvent in which the unexposed resist is not soluble. A negative resist material is one which is capable of polymerizing and/or insolubilizing upon exposure to imaging radiation.

One type of positive photosensitive material is based upon phenol-formaldehyde novolak polymers. A particular example of such is Shipley AZ1350 which is a m-cresol formaldehyde novolak polymer composition. Such is a positive resist composition and includes therein a diazoketone such as 2-diazo-1-naphthol-5-sulphonic acid ester. In such a composition the diazoketone, during the photochemical reaction, is converted to a carboxylic acid. This, in turn, renders the exposed resist film readily soluble in weakly alkali aqueous developer solvents. The composition usually contains about 15%, or so, by weight of the diazoketone compound.

A discussion of various photoresist materials can be found, for instance, in the *Journal of the Electrochemical Society*, Vol. 125, No. 3, March 1980, Deckert, et al., "Microlithography-Key to Solid-State Fabrication", pp. 45C–56C, disclosure of which is incorporated herein by reference.

In addition, certain siloxanes have been suggested as reactive ion etch barriers. For instance, see Fried, et al., IBM, *Journal Research Development*, Vol. 26, No. 8, pp. 362–371. Also, certain siloxanes have been suggested as e-beam sensitive resists. For instance, see Roberts, *Journal of Electrochemical Society*, Vol. 120, p. 1726, 1973; Roberts, *Phillips Technical Review*, Vol. 35, pp. 41–52, 1975; and Gazard, et al., *Applied Polymer Symposium*, No. 23, pp. 106–107, 1974.

Moreover, there have been suggestions that certain siloxanes, when imaged with electron beam (see Hatzakis, et al., *Processing Microcircuit Engineering* (Lausanne), p. 396, September 1981); and deep U.V. at about 2537 Angstrom (see Shaw, et al., *SPE Photopolymer Conference*, November 1982) act as an etch mask for an underlying polymer layer in an oxygen plasma.

U.S. Pat. No. 4,603,195 to Babich, et al. discloses materials which are resistant to dry-processing techniques and especially to reactive ion etching in oxygen plasma while, at the same time, capable of providing high resolution images. The compositions disclosed therein are obtained by interreacting a quinone diazo compound and an organosilicon compound.

In addition, examples of some dry-developable resists are provided in U.S. Pat. Nos. 4,426,247 to Tamamura, et al.; 4,433,044 to Meyer, et al.; 4,357,369 to Kilichowski, et al.; 4,430,153 to Gleason, et al.; 4,307,178 to Kaplan, et al.; 4,389,482 to Bargon, et al.; and 4,396,704 to Taylor. In addition, German patent application OS32 15082 (English language counterpart British patent application 2097143) suggests a process for obtaining negative tone plasma resist images. Such is concerned with a process involving entrapment of a silicon-containing monomer into a host film at the time of exposure to radiation and requires a processing step to expel the unincorporated silicon monomer from the film before plasma developing of the relief image.

A more recent example of a plasma developable resist is described in U.S. Pat. No. 4,552,833 in which a method is provided for obtaining a resist which is stated to be radiation sensitive and oxygen plasma developable. Such process involves coating a substrate with a film of a polymer that contains a masked reactive functionality, imagewise exposing the film to radiation under conditions that cause unmasking of the reactive functionality in the exposed regions of the film, treating the exposed film with a reactive organometallic reagent, and then developing the relief image by treatment with an oxygen plasma. The specific organometallic reagents described therein are trimethylstannyl chloride, hexamethyldisilazane, and trimethylsilyl chloride.

In addition, a method of obtaining a two-layer resist by top imaging a single layer resist is described in U.S. patent application Ser. No. 679,527 (FI9-84046, assigned to the assignee of the present application) which employs a monofunctional organometallic reagent.

Moreover, U.S. Pat. No. 4,782,008 (assigned to the assignee of the present application) discloses oxygen plasma resistant materials obtained by reacting a polymeric material with a multifunctional organometallic material. The organometallic material contains at least two functional groups which are reacted with reactive groups of the polymeric material. The polymeric material contains reactive hydroxyl groups and/or reactive hydroxyl functional precursor groups. The disclosures of the above two U.S. patent applications are incorporated herein by reference.

A further disclosure of photosensitive compositions containing organosilicon compounds can be found in U.S. Pat. No. 4,693,960.

U.S. Pat. No. 4,481,279 describes a dry developable radiation sensitive composition based upon polymeric materials containing unsaturated hydrocarbon bonds (e.g.—polybutadiene, epoxy-containing polymers and cyclolinear polymers) and certain organosilicon compounds which upon e-beam irradiation form a reaction product in the exposed areas. The reaction product is intended to be removed by oxygen plasma thereby providing a positive tone pattern.

Report RJ 4834 by McDonald et al. is of general interest concerning negative tone oxygen plasma developable resist based upon the photogeneration of a reactive functionality within the resist film which reacts with an organometallic reagent.

Moreover, photopolymerizable compositions that contain an epoxy polymer and various radiation sensitive onium salts have been suggested. For instance, see U.S. Pat. Nos. 4,069,055; 4,175,972; 4,572,890; 4,593,052; and 4,624,912.

SUMMARY OF THE INVENTION

The present invention provides a resist composition that, upon exposure to optical radiation and especially to U.V. wavelengths emitted by mercury vapor lamps, especially 436, 365, 303, 337 and 240 nanometers and deep UV, e.g. below about 240 nanometers, creates a latent image which then can be crosslinked in the exposed areas such as when heated to provide a negative image. The composition, upon crosslinking, is resistant to dry-processing techniques and especially to reactive ion etching in oxygen plasma. The compositions of the present invention are also thermally stable (e.g.—up to temperatures of about 380° C.) In addition, the compositions of the present invention exhibit good adhesion to a variety of substrates.

The present invention is concerned with a composition that contains in admixture:

a polymeric epoxide material containing glycido groups;

a di or polyfunctional organosilicon material, and an onium salt in an amount effective to initiate crosslinking of said polymeric epoxide material with said organosilicon.

The onium salt is present in amounts to increase the sensitivity of the composition to, for instance, deep U.V. irradiation.

The present invention is also concerned with a process for providing an image which includes providing on a substrate a layer of the organosilicon and polymeric epoxide compositions of the type disclosed above, imagewise selectively exposing the layer to a source of energy in a desired pattern creating exposed and unexposed regions; causing the organosilicon material to crosslink with said polymeric epoxide material in the exposed regions; vaporizing the unexposed regions; and then exposing to reactive ions to remove residual material in the unexposed regions.

Best and Various Modes for Carrying Out Invention

The compositions of the present invention contain a polymeric epoxide material containing glycido groups.

Typical examples of epoxy polymers include the epoxidized novolak polymers and the polyepoxides from halo-epoxy alkanes such as epichlorohydrin and a polynuclear dihydric phenol such as bisphenol A. Mixtures of epoxides can be used when desired.

The epoxidized novolak polymers are commercially available and can be prepared by known methods by the reaction of a thermoplastic phenolic aldehyde of a phenol with a halo-epoxy alkane. The phenol can be a mononuclear or polynuclear phenol. Examples of mononuclear phenols have the formula:

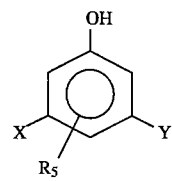

wherein X, Y, and $R_5$ are hydrocarbons containing no more than about 12 carbon atoms.

Hydrocarbon-substituted phenols having two available positions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and p-tert-butyl phenols, o- and p-secbutyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenol, o- and p-phenethyl phenols, o- and p-phenyl phenols, o- and p-tolyl phenols, o- and p-xylyl phenols, o- and p-cyclohexyl phenols, o- and p-cyclopentyl phenols, 4-phenethyl resorcinol, 4-tolyl resorcinol, and 4-cyclohexyl resorcinol.

Various chloro-substituted phenols which can also be used in the preparation of phenol-aldehyde resins suitable for the preparation of the epoxy novolaks include o- and p-chlorophenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chlorophenyl-phenol, 3,5-dichloro-4-methyl-phenol, 3,5-dichloro-5-methyl-phenol, 3,5-dichloro-2-methyl-phenol, 2,3- dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,5-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol.

Examples of polynuclear difunctional phenols are those having the formula:

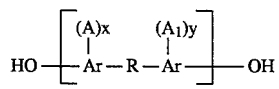

wherein Ar is an aromatic divalent hydrocarbon such as naphthylene and, preferably, phenylene; A and $A_1$ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and $R_6$ is a bond between adjacent carbon atoms as in dihydroxydiphenyl or is a divalent radical including, for example:

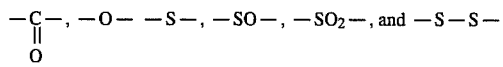

and divalent hydrocarbon radicals, such as alkylene alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2'-bis-(4-hydroxyphenyl)propane, 2,4-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1'-bis-(4-hydroxyphenol)ethane, 1,2'-bis-(4-hydroxyphenyl)ethane, 1,1'-bis-(4-hydroxy-2-chlorphenyl)ethane, 1,1'-bis-(3-methyl-4-hydroxyphenyl)ethane, 1,3-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis(2-isopropyl-4-hydroxyphenyl) pentane, 2,2'-bis-(4-hydroxyphenyl) heptane, bis-(4-hydroxyphenyl) phenylmethane, bis-(4-hydroxyphenyl) cyclohexylmethane, 1,2'-bis-(4-hydroxyphenyl)-1,2'-bis-(phenyl) propane and 2,2'-bis-(4-hydroxyphenyl)-1-phenyl-propane; di(hydroxyphenyl) sulfones such as bis-(4-hydroxyphenyl)sulfone, 2,4'-dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl) ether, bis-(4-hydroxy-3-bromophenyl)ether, bis-(4-hydroxynaphthyl) ether, bis-(4-hydroxy-3-chloronaphthyl) ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

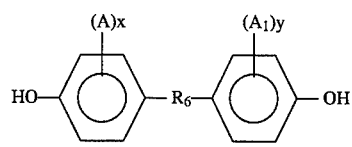

wherein A and $A_1$ are as previously defined, x and y have values from 0 to 4 inclusive and $R_6$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2'-bis(p-hydroxyphenyl)propane.

As condensing agents, any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as paraformaldehyde, hexamethylene tetramine. The aldehydes can also be used in the form of a solution, such as the commercially available formalin. The preferred aldehyde is formaldehyde.

The halo-epoxy alkane can be represented by the formula:

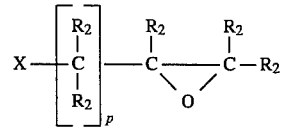

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group totals no more than 10 carbon atoms.

While glycidyl ethers such as derived from epichlorohydrin are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-2,3-epoxypentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro2-methyl-2,3-epoxyoctane, or 1-chloro-2,3- epoxydecane. Although it is possible to use haloepoxyalkanes having a greater number of carbon atoms than indicated above, there is generally no advantage in using those having a total of more than 10 carbon atoms.

The preferred epoxidized novolacs employed in the present invention are represented by the following average formulae:

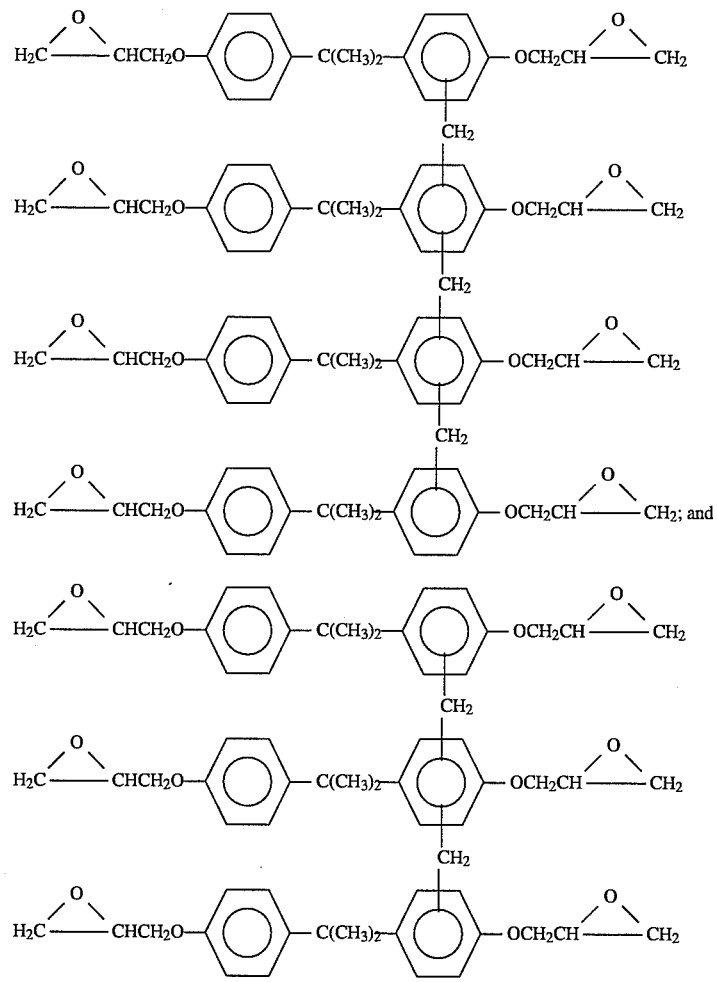

Polyepoxides represented by formula 1 are commercially available under the trade designation EPI-REZ SU8$^R$, and those represented by formula 2 are available under the trade designation EPI-REZ SU6$^R$. EPI-REZ SU8$^R$ is supplied as a 74% weight solution of the epoxy in methyl isobutyl ketone.

In addition, the polyepoxides of halo epoxy alkane of the type discussed above and a polynuclear dihydric phenol of the type above can be employed. The preferred polyepoxides of this class being the polyepoxides of epichlorohydrin and bisphenol A, i.e., 2,2-bis(p-hydroxyphenyl)propane.

The di- and polyfunctional organosilicon materials employed pursuant to the present invention include at least two functional groups capable of crosslinking glycidyl groups of the epoxide material.

The organosilicon material includes reactive epoxy group or reactive hydrogen group such as $NH_2$, OH and SH. Examples of suitable organosilicon materials include those represented by the formulae:

-continued

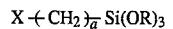

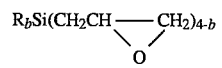

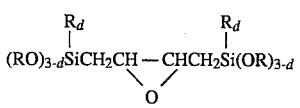

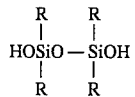

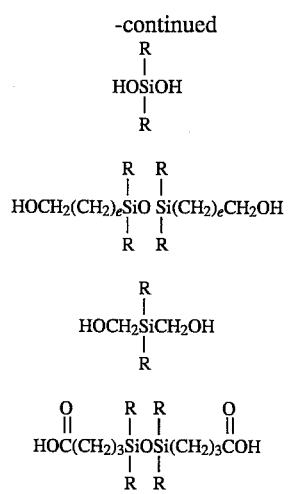

8)

9)

10)

11)

X is a reactive epoxy group or reactive hydrogen group such as $NH_2$, OH and SH.

The R radicals in the above formulae 3 to 11 are well-known and are typified by radicals usually associated with silicon-bonded organic groups and silicon-bonded hydrogen groups. Each R radical in the above formulae 3 and 4 is individually selected from the group of hydrogen, monovalent hydrocarbon radicals, halogenated monovalent hydrocarbon radicals, epoxy groups, mercapto radicals, and cyanoalkyl radicals. Thus, the radical R may be alkyl, such as methyl, ethyl, propyl, butyl, octyl; aryl radicals such as phenyl, tolyl, xylyl, napthyl radicals; aralkyl radicals such as benzyl, phenylethyl radicals; olefinically unsaturated monovalent hydrocarbon radicals such as vinyl, allyl, cyclohexenyl radicals; cycloalkyl radicals such as cyclohexyl, cycloheptyl; halogenated monovalent hydrocarbon radicals such as dichloropropyl, 1,1,1-trifluoropropyl, chlorophenyl, dibromophenyl, chloromethyl, and other such radicals; cyanoalkyl radicals such as cyanoethyl, and cyanopropyl. Preferably, the radicals represented by R have less than eight carbon atoms and in particular it is preferred that R be methyl, ethyl, or phenyl.

The "a" in formula 4 is an integer of 1–5 and preferably 3.

The "b" in formula 5 is an integer of 1–3.

The "d" in formula 6 is an integer of 0–3.

The "e" in formula 9 is an integer of 1 to about 10.

Examples of organosilicon materials suitable for use in the present invention are bis(hydroxydimethylsilyl)-benzene; bis(glycidoxypropyl)-tetramethyldisiloxane, glycidoxypropyltrimethoxy-silane glycidoxyphenyl trimethoxysilane, glycidoxy methyl silanes, tetramethyl siloxanediol; dimethylsiloxanediol; bis(hydroxypropyl)tetramethyl-disiloxane, and carboxypropyl tetramethyldisiloxane.

The amount of organosilicon material is usually about 5% to about 50% and preferably about 10% to about 25% per mole of polymeric epoxy material.

The compositions of the present invention also contain a radiation sensitive onium salt. The radiation sensitive onium salt is present in amounts effective to increase the radiation sensitivity of the composition and usually about 0.5% to about 20% by weight, and preferably about 1% to about 10% by weight based upon the weight of the polymeric epoxide material.

Examples of suitable onium salts include aromatic onium salts of Group VIa elements discussed in U.S. Pat. No. 4,175,972, disclosure of which is incorporated herein by reference, and aromatic onium salts of Group Va elements discussed in U.S. Pat. No. 4,069,055, disclosure of which is incorporated herein by reference.

Aromatic Group VIa onium salts include those represented by the formula:

$$[(R)_a(R^1)_b(R^2)_cX]_d^+[MQ_e]^{-(e-f)}$$

where R is a monovalent aromatic organic radical, $R^1$ is a monovalent organic aliphatic radial selected from alkyl, cycloalkyl and substituted alkyl, $R^2$ is a polyvalent organic radical forming a heterocyclic or fused ring structure selected from aliphatic radicals and aromatic radicals, X is a Group VIa element selected from sulfur, selenium, and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, $d=e-f$ f=valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl, and such radicals substituted with up to 1 to 4 monovalent radicals such as $C_{(1-8)}$ alkoxy, $C_{(1-8)}$ alkyl, nitro, chloro, and hydroxy; arylacyl radicals such as benzyl and phenylacyl; aromatic heterocyclic radicals such as pyridyl and furfuryl. $R^1$ radicals include $C_{(1-8)}$ alkyl such as methyl and ethyl, substituted alkyl such as $-C_2H_4OCH_3$, $-CH_2COOC_2H_5$, $-CH_2COCH_3$, etc. $R^2$ radicals include such structures as:

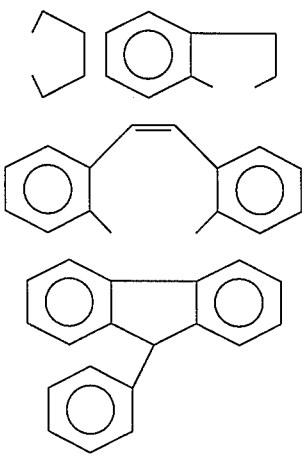

Complex anions included by $MQ_e^{-(e-f)}$ of Formula I are, for example, $BF_4^-$, $PF_6^-$, $SbF_6^-$, $FeCl_4^-$, $SnCl_6^-$, $SbCl_6^-$, $BiCl_5^-$, $AlF_6^{-3}$, $GaCl_4^-$, $InF_4^-$, $TiF_6^-$, $ZrF_6^-$, etc. where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc. and metalloids such as B, P, and As.

Group VIa onium salts included by Formula I are, for example:

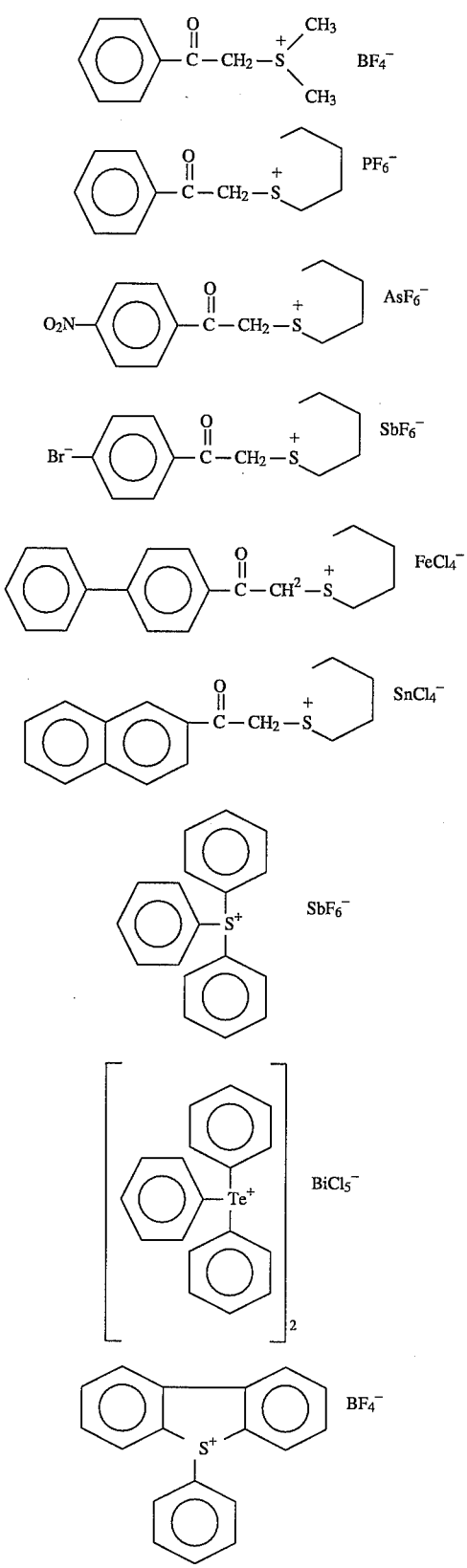

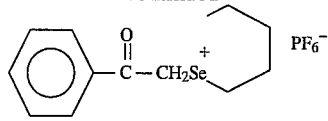

Aromatic group Va onium salts include those represented by the formula:

$$[(R)_a(R^1)_b(R^2)_cX^1]_d^+[MQ_a]^{-(e-f)} \qquad (2)$$

where R is a monovalent aromatic organic radical selected from carbocyclic radicals and heterocyclic radicals, $R^1$ is a monovalent organic aliphatic radical selected from alkyl, alkoxy, cycloalkyl and substituted derivatives thereof, $R^2$ is a polyvalent organic radical forming an aromatic heterocyclic or fused ring structure with $X^1$, $X^1$ is a Group Va element selected from N, P, As, Sb, and Bi, M is a metal or metalloid, Q is a halogen radical, a is a whole number equal to 0 to 4 inclusive, b is a whole number equal to 0 to 2 inclusive, c is a whole number equal to 0 to 2 inclusive, and the sum of a+b+c is a value equal to 4 or the valence of $X^1$, $$d=e-f$$

f=valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl and such radicals substituted with up to 1 to 4 monovalent radicals such as $C_{(1-8)}$ alkoxy, $C_{(1-8)}$ alkyl, nitro, chloro, and hydroxy; arylacyl radicals such as phenylacyl; arylalkyl radicals such as phenyl ethyl; aromatic heterocyclic radicals such as pyridyl and furfuryl; $R^1$ radicals include $C_{(1-8)}$ alkyl, $C_{(3-8)}$ cycloalkyl, substituted alkyl such as haloalkyl, for example, chloroethyl; alkoxy such as $OCH_2C_6H_5$ and $OCH_3$; alkoxyalkyl such as $-C_2H_4OCH_3$; alkylacyl such as $-CH_2COOC_2H_5$; ketoalkyl such as $-CH_2COCH_3$.

Radicals included by $R^2$ are, for example:

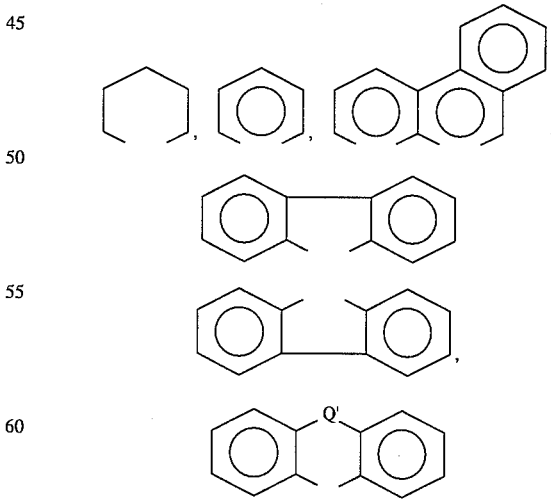

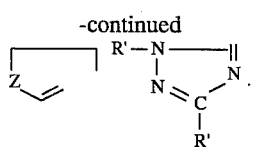

where Q' is selected from O, CH$_2$, N, R, and S; Z is selected from —O—, —S— and

and R' is a monovalent radical selected from hydrogen and hydrocarbon. Complex anions included by $MQ_e^{-(e-f)}$ are, for example, $BF_4^-$, $PF_6^-$, $AsF_6^-$, $FeCl_4^=$, $SnCl_6^-$, $SbCl_6^-$, $BiCl_5^=$, where M is more particularly a transition metal such as Sb, Fe, Sn, Bi, Al, Ga, In, Ti, Zr, Sc, V, Cr, Mn, and Co; rare earth elements such as the lanthanides, for example, Ce, Pr, and Nd; actinides such as Th, Pa, U, and Np; and metalloids such as B, P, and As.

In addition, it is noted that the compounds of the present invention can be admixed with conventional additives such as fillers, plasticizers, and diluents.

Examples of some inert diluents are diglyme, methyl isobutyl ketone, propylene glycol, methyl ether acetate, and ethyl acetate.

When used as a lithographic material, the compositions of the present invention are applied to a desired substrate to provide films, generally about 1500 angstroms to about 1 mil thick, and preferably about 2000 to about 3000 angstroms, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip. The compositions can be coated on a variety of substrates without requiring an adhesion primer layer.

In addition, the materials of the present invention can be used in conjunction with those substrates employed as chip carriers and including ceramic substrates and, especially, multilayer ceramic devices. Also included are dielectric substrates which can be thermoplastic and/or thermosetting polymers. Typical thermosetting polymeric materials include epoxy, phenolic-based materials, polyamides, and polyimides. The dielectric materials may be molded articles of the polymeric materials containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene; polysulfones; polycarbonates; nitrile rubber; and ABS polymers.

The compositions of the present invention are exposed to actinic radiation, preferably to deep U.V. of wavelength of about 230–290 and preferably 240 nanometers at energy levels of about 10 to about 15 millijoules or e-beam at 10 to about 100 kilovolts. Prior to exposure, prebake of the composition is not required.

The exposure to the radiation creates a latent image which when subjected to elevated temperatures, results in crosslinking in those regions which were exposed to the radiation since the compositions are of the negative resist type. The heating is generally carried at about 80 to about 120° C., typically about 90° C. for about 0.1 to about 25 minutes, typically about 10 to about 15 minutes. This heating results in crosslinking of the silicon material with the epoxide material in the exposed areas thereby incorporating the silicon component of the mixture chemically. At the same time, the heating causes vaporarization of material in the unirradiated areas of mixture resulting in thickness loss in such unirradiated areas thereby creating a relief pattern. A typical thickness loss is about 2 to about 3000 angstroms depending upon the extent of the exposure.

The film is then subjected to an oxygen plasma which removes the organic material in the unexposed areas at a rate at least ten times faster than that in the exposed areas. The exposed regions erode at a low rate since it contains silicon in an amount sufficient to create a layer of silicon oxide. Typical plasma parameters about are 10 mTorr $O_2$ pressure, about 0.15 w/cm$^2$ for about 5 minutes.

The following non-limiting examples are presented to further illustrate the present invention.

EXAMPLE 1

A mixture of a polymeric epoxide and an organosilicon material is obtained by admixing about 33.5 parts by weight of a 74% by weight solution of EPI-REZ SU8$^R$ in methyl isobutyl ketone; about 87.6 parts by weight of diglyme, about 12 parts by weight of bis(hydroxydimethylsilyl) benzene and about 1 part by weight of triphenyl sulfonium hexafluoride antimonate. The solids content of the mixture includes about 8.1% by weight of silicon. The composition is coated onto a silicon substrate at a thickness of about 5000 angstroms to about 10,000 angstroms and exposed imagewise in a predetermined pattern to deep ultraviolet light irradiation at about 230–290 nanometers at about 10–15 millijoules/cm$^2$. The coating is then postbaked by placing the coated substrate on a hot plate at about 90° C. for about 10–15 minutes resulting in a loss in thickness of the unexposed regions of about 10–20% due to vaporization of the organosilicon material. The layer is then subjected to oxygen plasma at about 10 mTorr $O_2$, and about 0.15 w/cm$^2$. This results in complete removal of the residual material in the unexposed regions while leaving about 80% of the thickness of the exposed layer.

The latter plasma process is optional for the described formulation.

What is claimed is:

1. A method for producing an image which comprises providing on a substrate a layer of an actinic radiation sensitive dry developable photoresist mixture containing:

a polymeric epoxide material containing glycidyl groups;
bis(hydroxydimethylsilyl)benzene; and
an onium salt in an amount effective to initiate crosslinking of said polymeric epoxide material with said bis(hydroxydimethylsilyl)benzene;
imagewise selectively exposing said mixture to a source of energy creating exposed and unexposed regions;

causing said organosilicon material to crosslink with said polymeric epoxide material in said exposed regions;

vaporizing said unexposed regions;

and then exposing to reactive ions to remove residual material in said unexposed regions.

2. The method of claim 1 wherein said source of energy is deep U.V. radiation or e-beam.

3. The method of claim 1 wherein said source of energy is about 230 to about 290 nanometers at a dosage of about 10–15 millijoules/cm$^2$.

4. The method of claim 1 wherein said source of energy is e-beam at about 10 to about 100 kilovolts.

5. The method of claim 1 wherein said unexposed regions are vaporized by heating at about 80° C. to about 120° C.

6. The method of claim 1 wherein said reactive ions are from oxygen plasma.

7. The method of claim 1 wherein the amount of the organosilicon compound in said mixture is about 5 to about 50% per mole of epoxide.

8. The method of claim 1 wherein said polymeric epoxide material is selected from the group of epoxidized novolacs having the average formulae:

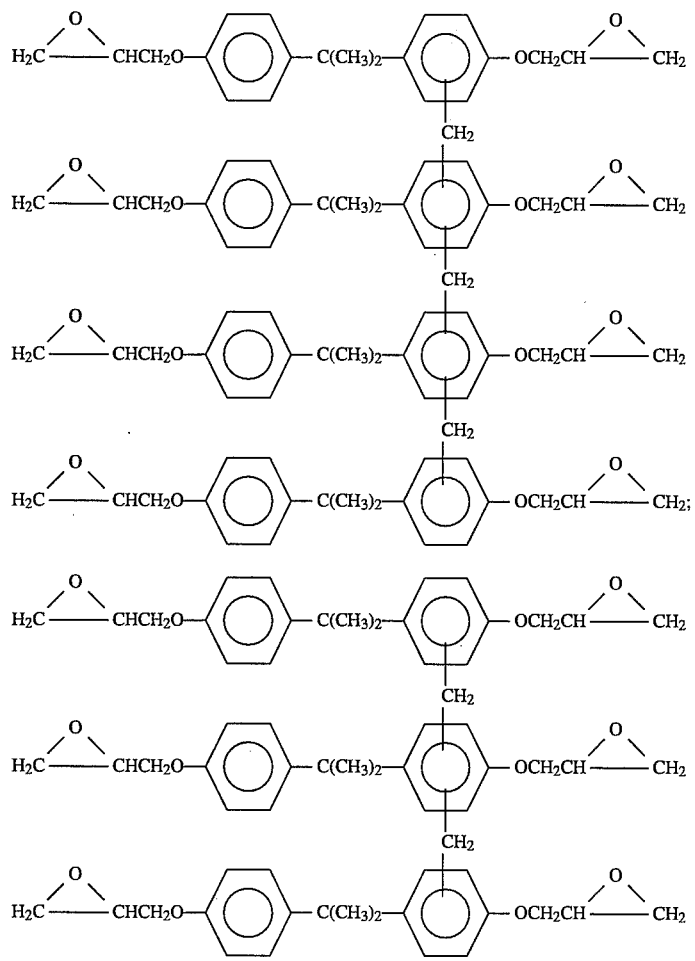

9. The method of claim 1 wherein said polymeric epoxide has the average formula:

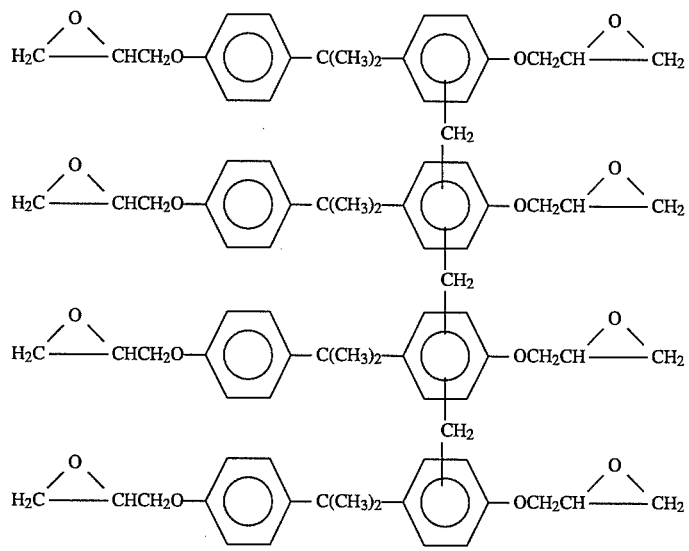

10. The method of claim 1 wherein said polymeric epoxide has at least 6 terminal epoxy groups.

11. The method of claim 1 wherein said polymeric epoxide has at least 8 terminal epoxy groups.

12. The method of claim 1 wherein said onium salt is an aromatic salt of a Group VIa element.

13. The method of claim 1 wherein said onium salt is triphenyl sulfonium hexafluoride antimonate.

14. The method of claim 1 wherein the amount of said onium salt is about 0.5% to about 5% by weight based upon the weight of the polymeric epoxide material.

15. The method of claim 1 wherein the amount of the bis(hydroydimethylsilyl)benzene in said mixture is about 10 to about 25% per mole of epoxide.

* * * * *